US008802990B2

(12) United States Patent
Clevenger et al.

(10) Patent No.: US 8,802,990 B2
(45) Date of Patent: Aug. 12, 2014

(54) SELF-ALIGNED NANO-SCALE DEVICE WITH PARALLEL PLATE ELECTRODES

(75) Inventors: Lawrence A. Clevenger, LaGrangeville, NY (US); Zhengwen Li, Fishkill, NY (US); Kevin S. Petrarca, Newburgh, NY (US); Roger A. Quon, Rhinebeck, NY (US); Carl J. Radens, LaGrangeville, NY (US); Brian C. Sapp, Gainesville, FL (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 13/432,037

(22) Filed: Mar. 28, 2012

(65) Prior Publication Data
US 2012/0189767 A1  Jul. 26, 2012

Related U.S. Application Data

(62) Division of application No. 12/488,948, filed on Jun. 22, 2009, now Pat. No. 8,476,530.

(51) Int. Cl.
*H01B 5/14* (2006.01)
*H01L 21/76* (2006.01)
*H01L 21/764* (2006.01)

(52) U.S. Cl.
USPC ......... 174/126.4; 438/243; 438/412; 257/301

(58) Field of Classification Search
USPC .............. 427/58, 69, 78; 174/126.4; 438/243, 438/412; 257/301
See application file for complete search history.

(56) References Cited

U.S. PATENT DOCUMENTS

| 4,690,729 A | 9/1987 | Douglas |
| 5,081,515 A | 1/1992 | Murata et al. |

(Continued)

FOREIGN PATENT DOCUMENTS

| CN | 1718534 A | 1/2006 |
| CN | 1997588 A | 7/2007 |

(Continued)

OTHER PUBLICATIONS

Letter from IBM China which indicates that the date of the issued Office Action is Oct. 29, 2012 in Chinese Patent Application No. 201010204843.5, Letter dated Nov. 1, 2012.

*Primary Examiner* — Jeremy C Norris
*Assistant Examiner* — Nathan Milakovich
(74) *Attorney, Agent, or Firm* — Scully, Scott, Murphy & Presser, P.C.; Joseph P. Abate

(57) ABSTRACT

A contiguous deep trench includes a first trench portion having a constant width between a pair of first parallel sidewalls, second and third trench portions each having a greater width than the first trench portion and laterally connected to the first trench portion. A non-conformal deposition process is employed to form a conductive layer that has a tapered geometry within the contiguous deep trench portion such that the conductive layer is not present on bottom surfaces of the contiguous deep trench. A gap fill layer is formed to plug the space in the first trench portion. The conductive layer is patterned into two conductive plates each having a tapered vertical portion within the first trench portion. After removing remaining portions of the gap fill layer, a device is formed that has a small separation distance between the tapered vertical portions of the conductive plates.

19 Claims, 7 Drawing Sheets

(56) References Cited

U.S. PATENT DOCUMENTS

| | | |
|---|---|---|
| 5,143,861 A | 9/1992 | Turner |
| 5,357,132 A | 10/1994 | Turner |
| 5,719,073 A | 2/1998 | Shaw et al. |
| 5,959,325 A | 9/1999 | Adair et al. |
| 6,091,078 A | 7/2000 | Codama |
| 6,130,470 A | 10/2000 | Selcuk |
| 6,184,151 B1 | 2/2001 | Adair et al. |
| 6,207,532 B1 | 3/2001 | Lin et al. |
| 6,407,420 B1 | 6/2002 | Yamanaka et al. |
| 6,461,888 B1 | 10/2002 | Sridhar et al. |
| 6,570,238 B2 | 5/2003 | Hui et al. |
| 6,576,510 B2 | 6/2003 | Yamanaka et al. |
| 6,635,898 B2 * | 10/2003 | Williams et al. ......... 257/14 |
| 6,661,048 B2 | 12/2003 | Yamanaka et al. |
| 6,766,082 B2 | 7/2004 | Hirabayashi et al. |
| 7,023,065 B2 * | 4/2006 | Ayazi et al. ........... 257/414 |
| 7,349,223 B2 | 3/2008 | Haemer et al. |
| 7,803,421 B2 * | 9/2010 | Onodera et al. ......... 427/79 |
| 7,927,966 B2 * | 4/2011 | Hoang et al. ........... 438/427 |
| 8,084,812 B2 * | 12/2011 | Kitamura et al. ........ 257/329 |
| 2001/0019145 A1 | 9/2001 | Yamanaka et al. |
| 2002/0005534 A1 | 1/2002 | Yamanaka et al. |
| 2002/0127495 A1 | 9/2002 | Scherer |
| 2004/0047201 A1 | 3/2004 | Yamanaka et al. |
| 2004/0240770 A1 | 12/2004 | Junnarkar et al. |
| 2007/0163887 A1 | 7/2007 | Hofmann |
| 2008/0052904 A1 | 3/2008 | Schneider et al. |
| 2008/0067494 A1 | 3/2008 | Mammana et al. |
| 2008/0079113 A1 | 4/2008 | Chinthakindi et al. |
| 2010/0200540 A1 * | 8/2010 | Conn ................... 216/17 |

FOREIGN PATENT DOCUMENTS

| | | |
|---|---|---|
| CN | 101419092 A | 4/2009 |
| EP | 0 386 947 A2 | 9/1990 |
| EP | 0 386 947 B1 | 9/1995 |
| EP | 1 622 435 A1 | 2/2006 |
| EP | 1 709 849 B1 | 8/2007 |
| WO | WO 2005/076681 A1 | 8/2005 |
| WO | WO 2006/010639 A2 | 2/2006 |

* cited by examiner

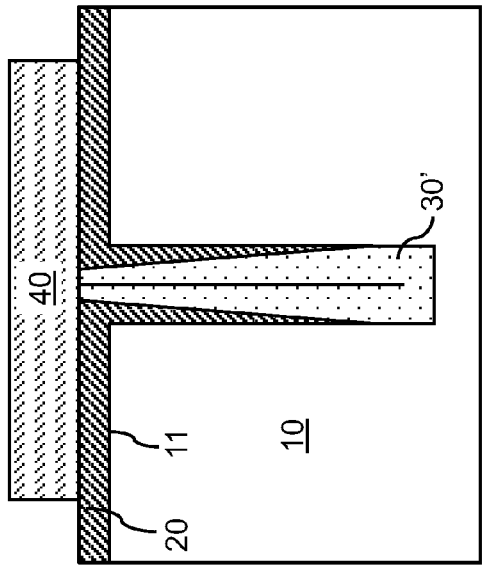
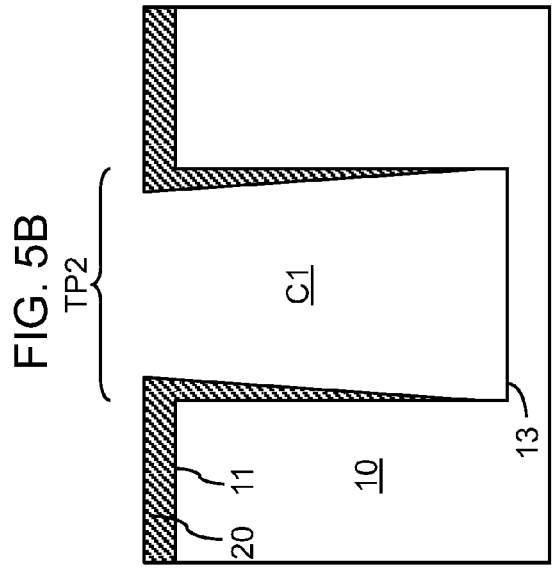
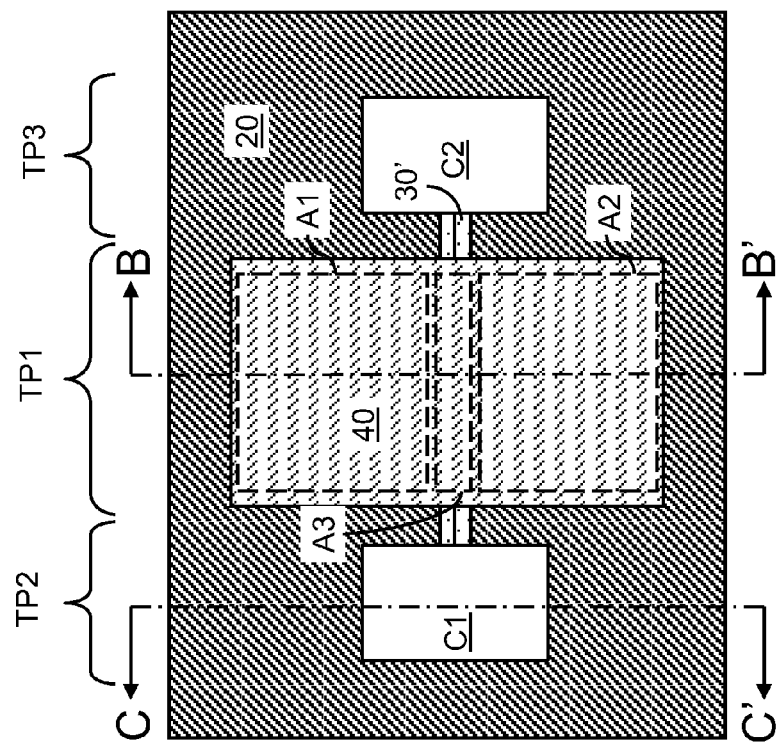
FIG. 5B
FIG. 5C
FIG. 5A

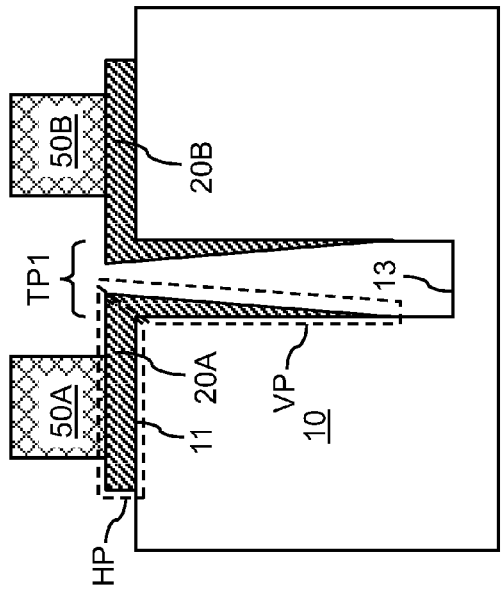
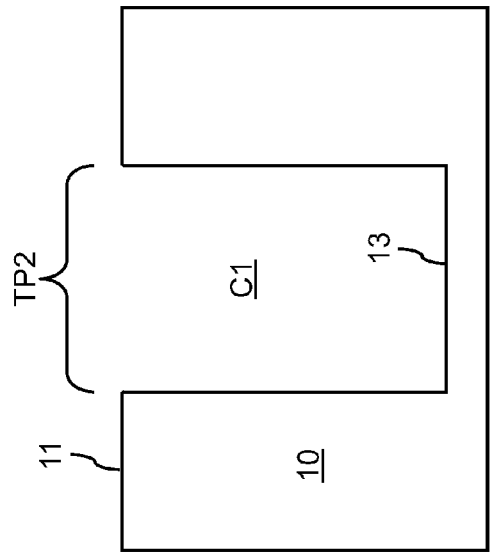
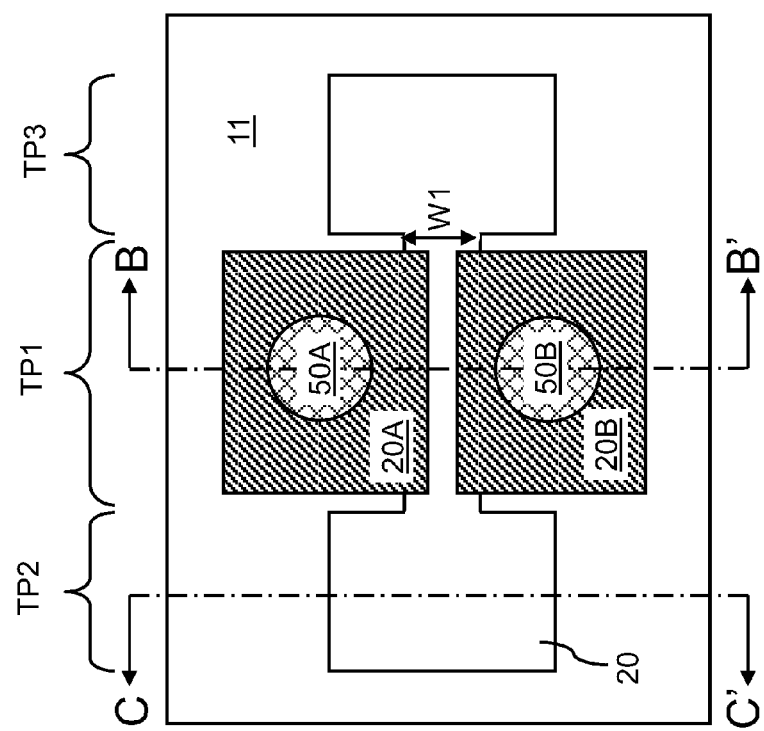
FIG. 7B
FIG. 7C
FIG. 7A

SELF-ALIGNED NANO-SCALE DEVICE WITH PARALLEL PLATE ELECTRODES

CROSS REFERENCE TO RELATED APPLICATION

This application is a divisional of U.S. patent application Ser. No. 12/488,948, filed Jun. 22, 2009 the entire content and disclosure of which is incorporated herein by reference.

BACKGROUND

The present invention relates to a microstructure, and particularly a device with a pair of parallel conductive plates that may be employed as a detector, a signal filter, or a passive device, and methods of manufacturing the same.

Many nano-scale devices require a pair of conductive plates having a small separation distance. Such nano-scale devices include a detector, a passive device, or a signal filter. For example, the detector may be a particle detector, a pH detector, a fire alarm, or any other type of device configured to detect change of the composition of the material between a pair of conductive plates. The passive device may be a capacitor, an inductor, or a combination thereof. The signal filter is a set of electronic devices including at least one capacitor or inductor that is configured to provide a signal filtering function.

Such nano-scale devices require a small separation distance between the pair of conductive plates. For example, a capacitor requires a small separation distance to increase the capacitance. A detector requires a small distance to maximize the change in the detected signal.

Control of the separation distance between a pair of conductive plates is limited by available manufacturing methods. Typically, the limitation on the separation distance is imposed by the smallest dimension that available lithography tools can print. Despite continuing progress in lithographic technology, the critical dimension, i.e., the smallest dimension that a lithographic tool may print, is about 40 nm as of 2009. Reducing the separation distance to a dimension less than the critical dimension faces difficulties.

BRIEF SUMMARY

In the present invention, a device with a pair of parallel conductive plates that have self-aligned edges and having a small separation distance is provided. First, a contiguous deep trench is formed on an insulating substrate. The contiguous deep trench includes a first trench portion having a constant width between a pair of first parallel sidewalls, second and third trench portions each having a greater width than the first trench portion and laterally connected to the first trench portion. A non-conformal deposition process is employed to form a conductive layer that has a tapered geometry within the contiguous deep trench portion such that the conductive layer is not present on bottom surfaces of the contiguous deep trench. A gap fill layer is formed to plug the space in the first trench portion, while cavities are present within the second and third trench portions. The exposed portions of the gap fill layer are removed and the conductive layer is patterned into two conductive plates each having a tapered vertical portion within the first trench portion. Removal of the remaining portions of the gap fill layer provides the device of the present invention. The pair of parallel conductive plates has a small separation distance between the tapered vertical portions.

According to an aspect of the present invention, a device structure is provided. The innovative device structure includes a substrate including an insulating layer; a contiguous trench including first, second, and third trench portions and located in the insulating layer, wherein the first trench portion has a pair of first parallel sidewalls separated by a first width, and the second and third trench portions are directly and laterally adjoined to the first trench portion; and a pair of conductive plates, each located on one side of the first trench portion, not contacting the other of the pair of conductive plates, and having a horizontal portion and a tapered vertical portion, wherein the horizontal portion is located directly on a horizontal surface of the insulating layer, and wherein a width of the tapered vertical portion decreases from the horizontal surface with distance toward a bottom surface of the contiguous trench.

According to another aspect of the present invention, a method of forming a device structure is provided. The method includes forming a contiguous trench in an insulating layer of a substrate, wherein the contiguous trench includes first, second, and third trench portions, wherein the first trench portion has a pair of first parallel sidewalls separated by a first width, and the second and third trench portions are directly and laterally adjoined to the first trench portion; and forming a pair of conductive plates directly on the first trench portion and a horizontal surface of the insulating layer, wherein each of the pair of conductive plates does not contact the other of the pair of conductive plates, wherein each of the pair of conductive plates has a horizontal portion and a tapered vertical portion, and wherein a width of the tapered vertical portion decreases from the horizontal surface with distance toward a bottom surface of the contiguous trench.

In one embodiment, the method further includes forming a conductive layer directly on the horizontal surface of the insulating layer and an upper portion of sidewalls of the contiguous trench, wherein the conductive layer does not contact a bottom surface of the contiguous trench or a lower portion of the sidewalls of the contiguous trench.

In another embodiment, the method further includes forming a gap fill layer on the conductive layer, wherein the gap fill layer completely plugs the first trench portion, and wherein a first cavity is present in the second trench portion and a second cavity is present in the third trench portion.

In yet another embodiment, the method further includes patterning the conductive layer to form the pair of conductive plates, wherein the conductive layer is removed from within the second and third trench portions.

BRIEF DESCRIPTION OF THE SEVERAL VIEWS OF THE DRAWINGS

FIG. 5A is a top-down view of the exemplary device structure after patterning a masking layer over a first trench portion TP1. FIGS. 5B and 5C are vertical cross-sectional views of the exemplary device structure in FIG. 5A along the vertical planes B-B' and C-C', respectively.

FIG. 7A is a top-down view of the exemplary device structure after forming first and second conductive contact structures. FIGS. 7B and 7C are vertical cross-sectional views of the exemplary device structure in FIG. 7A along the vertical planes B-B' and C-C', respectively.

DETAILED DESCRIPTION

Figure 1B:
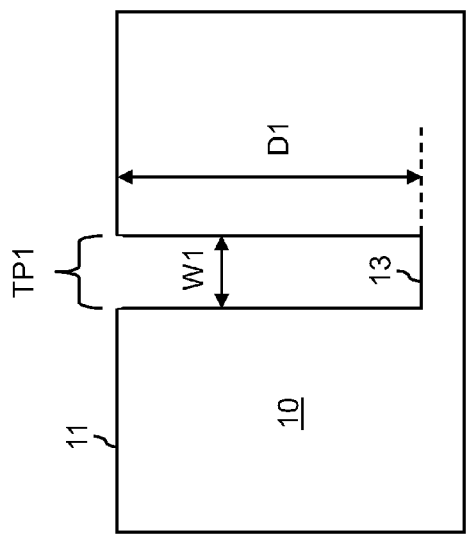
FIGS. 1B and 1C are vertical cross-sectional views of the exemplary device structure in FIG. 1A along the vertical planes B-B' and C-C', respectively.

As stated above, the present invention relates to a device with a pair of parallel conductive plates that may be employed as a detector, a signal filter, or a passive device, and methods of manufacturing the same. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 1C:
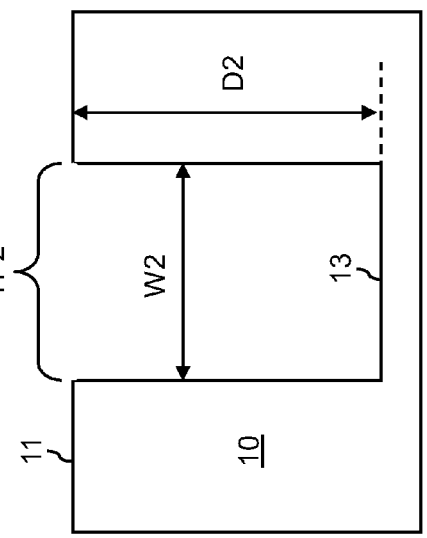
Figure 1A:
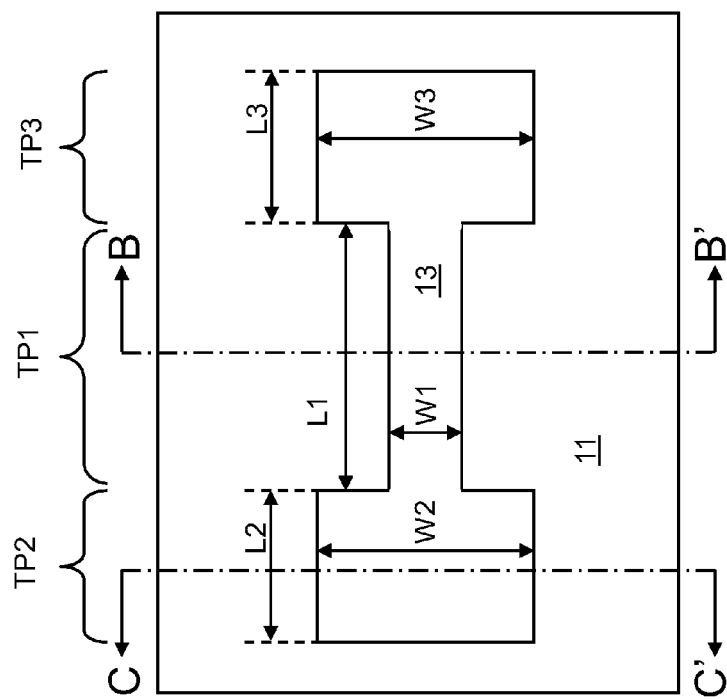
FIG. 1A is a top-down view of an exemplary device structure of the present invention after formation of a contiguous deep trench.

Referring to FIGS. 1A-1C, an exemplary device structure according to the present invention includes a substrate 10 and a contiguous deep trench formed therein. The substrate 10 includes an insulating layer. In one embodiment, the substrate 10 itself may be the insulating layer. In another embodiment, the substrate 10 may include a handle substrate (not shown) that provides mechanical stability, and the insulation layer is an upper portion of the substrate located on the handle substrate. The insulation layer comprises an insulating material such as a dielectric oxide, a dielectric nitride, or any other dielectric material. The thickness of the insulator layer may be from 300 nm to 1,000 microns, and typically from 1 micron to 100 microns, and more typically from 10 microns to 30 microns, although lesser and greater thicknesses are also contemplated herein.

The contiguous trench is formed, for example, by applying a photosensitive material (not shown) on a top surface 11 of the substrate 10, patterning the photosensitive material, and transferring the pattern in the photosensitive material into the substrate 10 by an anisotropic etching process employing the patterned photosensitive material as an etch mask. The photosensitive material is subsequently removed. In this case, all sidewalls of the continuous trench are substantially vertical, i.e., substantially perpendicular to the top surface 11 of the substrate. For example, the taper angle of the continuous trench, as measured from a vertical line, may be from zero to 3 degrees, and preferable, from zero to 1 degree.

The contiguous trench formed in the insulating layer of the substrate 10 includes a first trench portion TP1, a second trench portion TP2, and a third trench portion TP3. The first trench portion TP1 has a pair of first parallel sidewalls separated by a first width W1. Each of the pair of first parallel sidewalls has a dimension from one lateral end to the opposite lateral end, which is herein referred to as a first length L1. The second trench portion TP2 is directly and laterally adjoined to one end of the first trench portion TP1. Each of the pair of first parallel sidewalls of the first trench portion TP1 extends from the second trench portion TP2 to the third trench portion TP3. The third trench portion TP3 is directly and laterally adjoined to the other end of the first trench portion TP1. Thus, the second trench portion TP2 and the third trench portion TP3 are separated by the first length L1. Preferably, the first length L1 is greater than the first width W1. Each trench portion (TP1, TP2, TP3) has a bottom surface 13, which may be substantially planar and parallel to the top surface 11 of the substrate. The top surface 11 of the substrate 10, the bottom surface 13 of the trench portions (TP1, TP2, TP3), and all sidewalls of the trench portions (TP1, TP2, TP3) are insulator surfaces, which are exposed surfaces of the insulator layer within the substrate 10.

Each of the second and third trench portions (TP2, TP3) has horizontal cross-sectional area that includes at least a circle having a diameter of the first width W1. The horizontal cross-sectional area of the second trench portion TP2 may have any shape that includes all areas of a circle having the diameter of the first width W1. For example, the shape of the horizontal cross-sectional area of the second trench portion TP2 may be a rectangle, an oval, or any other shape with an opening having the first width W1 on the side that adjoins the first trench portion TP1. Likewise, the shape of the horizontal cross-sectional area of the third trench portion TP3 may be a rectangle, an oval, or any other shape with an opening having the first width W1 on the side that adjoins the first trench portion TP1.

The smallest distance between any portion of the sidewall surfaces of the second trench portion TP2 is greater than the first width W1. In case the second trench portion TP2 has a rectangular cross-sectional area, and has a pair of second parallel sidewalls separated by a second width W2, the second width is greater than the first width W2. The lateral dimension of each of the second parallel sidewalls, which is herein referred to as a second length L2, is also greater than the first width W1. In case the third trench portion TP3 has a rectangular cross-sectional area, and has a pair of third parallel sidewalls separated by a third width W3, the second width is greater than the first width W2. The lateral dimension of each of the third parallel sidewalls, which is herein referred to as a third length L2, is also greater than the first width W1.

The first width W1 is a lithographic dimension, i.e., a dimension that is greater than a critical dimension. The critical dimension herein refers to the smallest dimension that may be printed employing available lithography tools. The critical dimension decreases with availability of improved lithography tools, and is about 40 nm as of the filing date of the instant application. The range of the first width W1 is from the critical dimension to 10 microns, and typically from the critical dimension to 1 micron, and more typically from the critical dimension to 100 nm, although lesser and greater dimensions are also contemplated herein.

The depth of the first trench portion TP1 is herein referred to as a first depth D1, which is greater than the first width W1. The aspect ratio of the first trench portion TP1, i.e., the numerical ratio of the first depth D1 to the first width W1, is preferably greater than 3.0, and more preferably greater than 10.0. The aspect ratio of the first trench portion TP1 may be as large as 10,000, and is limited only by the capability to etch the material of the substrate 10 to a depth required to achieve such an aspect ratio.

Likewise, the depth of the first trench portion TP2 is herein referred to as a second depth D2, which is greater than the first width W1. The aspect ratio of the second trench portion TP2, i.e., the numerical ratio of the second depth D2 to the lesser of the second width W2 and the second length L2, may be from 0.01 to 1,000, and typically from 0.1 to 100, and more typically from 1 to 10, although lesser and greater aspect ratios are also contemplated herein. The aspect ratio of the third trench portion TP3, i.e., the numerical ratio of the depth of the third trench portion TP3 to the lesser of the third width W3 and the third length L3, may have a similar range as the aspect ratio of the second trench portion TP2. In case the second and/or third trench portions (TP2, TP3) has a non-rectangular cross-sectional area, the smallest lateral dimension between every pair of sidewalls of each trench portion may be employed instead of the lesser of the width and the length of each trench portion to calculate the aspect ratio. The first depth D1 may, or may not, be the same as the second depth D2 depending on the effect of the pattern factor of the anisotropic etch process on the depth of the trench portions, i.e., the effect of the areal density of the etched area on the depth of each trench portions.

Figure 2A:
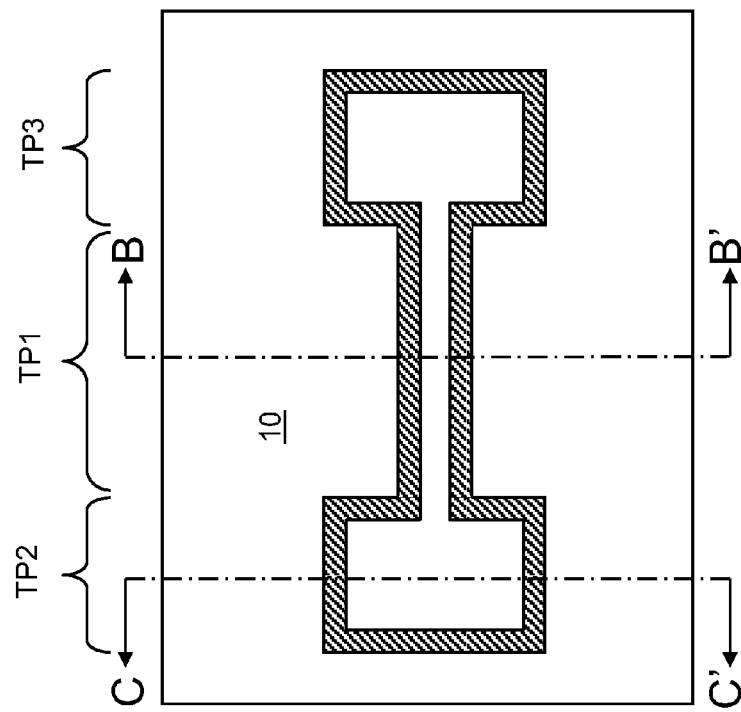
FIG. 2A is a horizontal cross-sectional view along the plane A-A' in FIGS. 2B and 2C of the exemplary device structure after formation of a conductive layer.
Figure 2B:
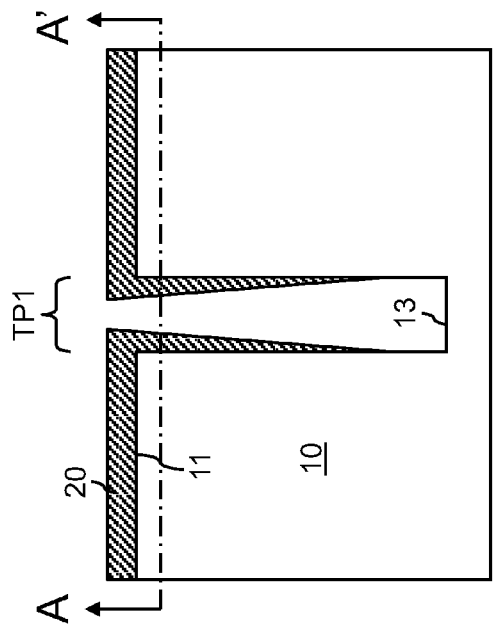
FIGS. 2B and 2C are vertical cross-sectional views of the exemplary device structure in FIG. 2A along the vertical planes B-B' and C-C', respectively.
Figure 2C:
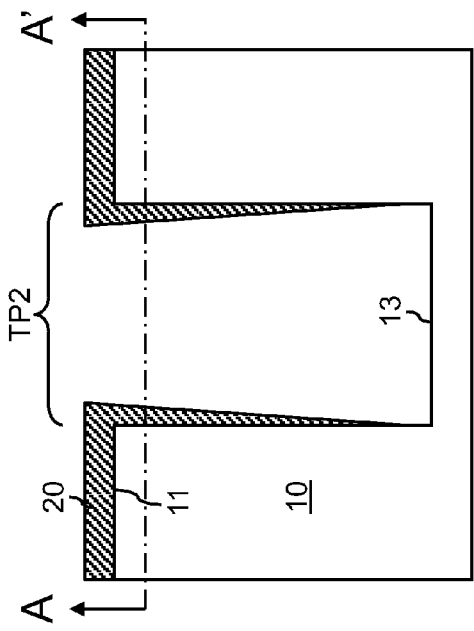

Referring to FIGS. 2A-2C, a conductive layer 20 is formed on the top surface 11, which is an upper horizontal surface of the insulating layer, of the substrate 10. Further, the conductive layer 20 extends into upper portions of the sidewalls of the contiguous deep trench. The conductive layer 20 has a tapered profile in each of the first, second, and third trench portions (TP1, TP2, TP3), and the thickness of the conductive layer 20 decreases with distance from the top surface 11 of the substrate 10, which is a horizontal surface of the insulating layer.

The conductive layer 20 is formed by employing a non-conformal deposition process. A non-conformal deposition process produces a non-conformal film, i.e., a film having different thicknesses depending on geometry. Specifically, areas located closer to a source reactant gas accumulate more deposition that areas located farther way from the source reactant gas. Thus, the thickness of the conductive layer 20 on the top surface 11 of the substrate 10 is greater than the thickness of the conductive layer 20 within any portion of the contiguous deep trench, which has a recessed geometry. Further, the thickness of the conductive layer 20 decreases with distance from the top surface 11 of the substrate 10 within the contiguous deep trench.

In one embodiment, the aspect ratio of the first trench portion TP1 is sufficiently high, e.g., greater than 10, and the deposition process is sufficiently non-conformal so that no material of the conductive layer 20 is deposited at the bottom of the sidewalls of the first trench portion TP1. In this case, conductive layer 20 terminates at a depth less than the first depth D1 with a wedge shape profile. The thickness of the conductive layer 20 monotonically, and typically strictly, decreases with distance from the top surface 11 of the substrate 10.

The conductive layer 20 may, or may not, be deposited on the portions of the bottom surface 13 located within the second and third trench portions (TP2, TP3) depending on the aspect ratios of the second and third trench portions (TP2, TP3).

In another embodiment, the aspect ratio of the first trench portion TP1 is not sufficiently high, e.g., on the order of 2 or less, and the deposition process is not sufficiently non-conformal so that the thickness of the conductive layer 20 does not decrease to zero at the bottom of the sidewalls of the first trench portion TP1. In this case, the conductive layer 20 may cover all surfaces of the insulator layer of the substrate 10. An isotropic etch back process is employed to isotropically remove some of the material in the conductive layer 20. Because the removal process is isotropic, the thickness of the conductive layer 20 is reduced by the same amount across all surfaces of the conductive layer 20. The thickness of removal of the material of the conductive layer 20 is greater than the thickness of the conductive layer 20 at the bottom of the sidewalls of the first trench portion TP1 as deposited. Thus, no material of the conductive layer 20 remains at the bottom of the sidewalls of the first trench portion TP1 after the isotropic etch back process. The isotropic etch back process may be an isotropic dry etch process or a wet etch process.

In either embodiment, the conductive layer 20 terminates at a depth less than the first depth D1 with a wedge shape profile at the end of the deposition step or at the end of the combination of deposition and etch back. The thickness of the conductive layer 20 monotonically, and typically strictly, decreases with distance from the top surface 11 of the substrate 10. The thickness of the conductive layer 20 as measured at the top surface 11 of the substrate 10 is less than one half of the first width so that the a gap remains between two portions of the conductive layer 20 at the opening of the first trench portion TP1. The thickness of the conductive layer 20 as measured at the top surface 11 of the substrate 10 may be from 3 nm to 5 microns, although lesser and greater thicknesses are also contemplated herein.

The conductive layer 20 may, or may not, be deposited on the portions of the bottom surface 13 located within the second and third trench portions (TP2, TP3) depending on the aspect ratios of the second and third trench portions (TP2, TP3). Tapered vertical portions of the conductive layer 20 terminate on sidewalls of the first trench portion TP1. Thus, the tapered vertical portions within the first trench portion TP1 does not directly contact any bottom surface 13 of the contiguous trench.

In one case, the conductive layer 20 does not contact any bottom surface 13 of the contiguous trench or any lower portion of the sidewalls of the contiguous trench. In another case, the conductive layer 20 does not contact any portion of the bottom surface 13 within the first trench portion TP1, but the conductive layer 20 contacts the portions of the bottom surface within the second and/or third trench portions (TP2, TP3).

The conductive layer 20 comprises a conductive material such as a metal or a doped semiconductor material. In a preferred embodiment, the conductive layer 20 consists essentially of at least one metal such as, but not limited to, Au, Ag, Cu, Al, W, and/or at least one conductive metal compound such as, but not limited to, TiN, TaN, and WN.

Figure 3B:
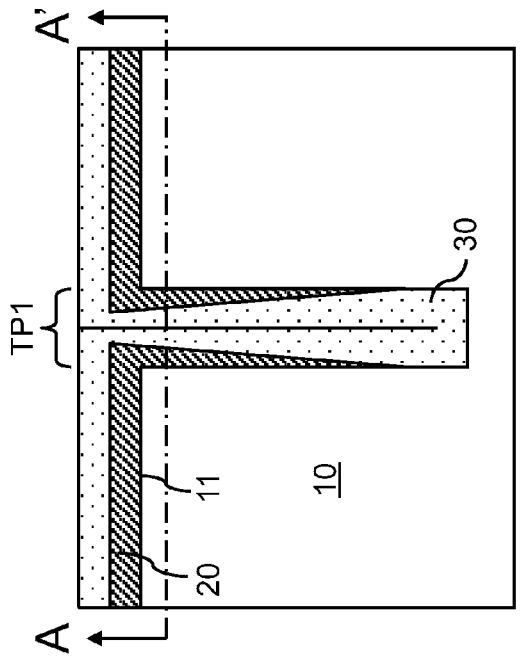
FIGS. 3B and 3C are vertical cross-sectional views of the exemplary device structure in FIG. 3A along the vertical planes B-B' and C-C', respectively.
Figure 3C:
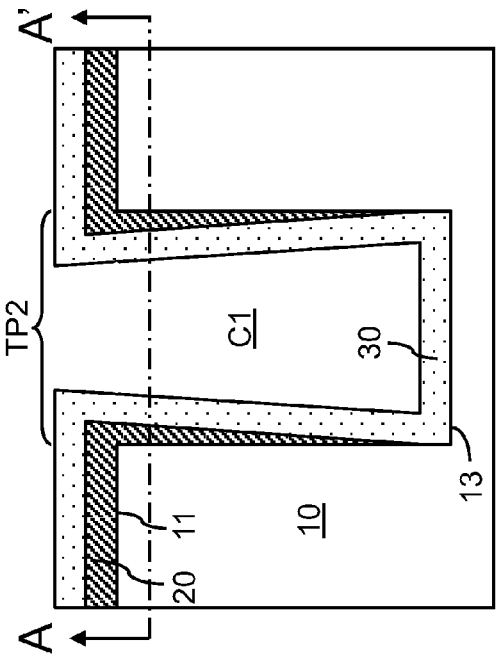
Figure 3A:
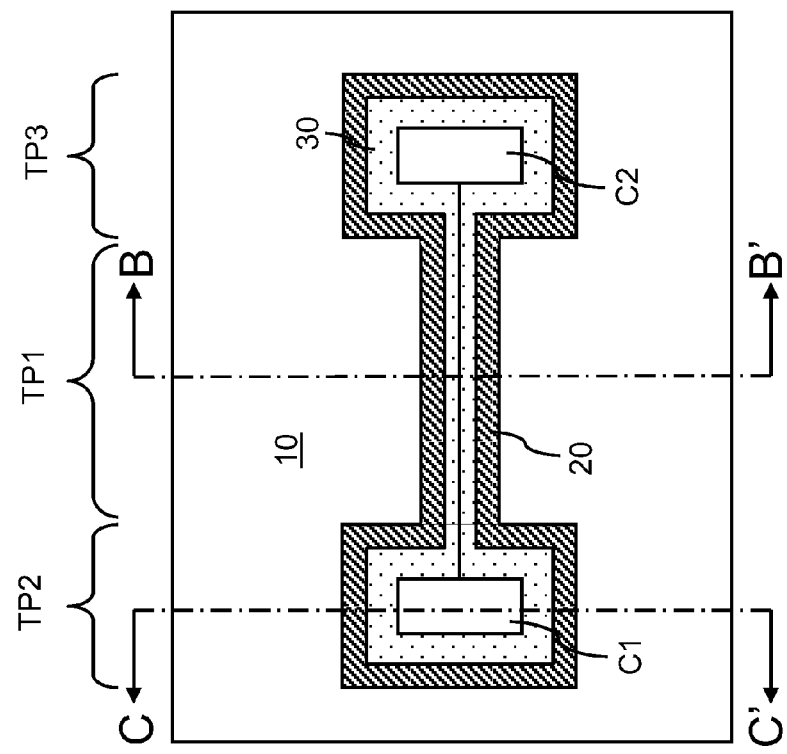
FIG. 3A is a horizontal cross-sectional view along the plane A-A' in FIGS. 3B and 3C of the exemplary device structure after formation of a gap fill layer.

Referring to FIGS. 3A-3C, a gap fill layer 30 is formed on the conductive layer 20 by a conformal deposition process. The thickness of the gap fill layer 30 as measured on the horizontal surface of the conductive layer 20 above the top surface 11 of the substrate 10 is greater than the first width W1. The gap fill layer 30 first plugs up the upper portion of the first trench portion TP1. Because the reactants enter into the lower portion of the first trench portion TP1 through the second and third trench portions (TP2, TP3), the lower portion of the first trench portion TP1 continues to be filled until the entire first trench portion TP1 is completely plugged by the gap fill layer 30. Thus, the combination of the conductive layer 20 and the gap fill layer 30 completely plugs the first trench portion TP1.

The thickness of the gap fill layer 30 is less than the smallest dimension between opposing pairs of sidewalls in the second trench TP2 and in the third trench TP3. Thus, a first cavity C1 is present in the second trench portion TP2 and a second cavity C2 is present in the third trench portion TP3, i.e., the second trench portion TP2 and the third trench portion TP3 are not completely filled by the combination of the conductive layer 20 and the gap fill layer 30.

The gap fill layer 30 includes a material that is different from the material of the conductive layer 20. Preferably, but not necessarily, the material of the gap fill layer 30 is different from the material of the insulator layer that constitute the upper portion of the substrate 10 and contacting the conductive layer 20. The gap fill layer 20 may be a dielectric material or a semiconductor material different from the material of the conductive layer 20. Non-limiting exemplary materials for the gap fill layer 30 include silicon oxide, silicon nitride, and amorphous or polycrystalline silicon containing semiconductor material.

Figure 4B:
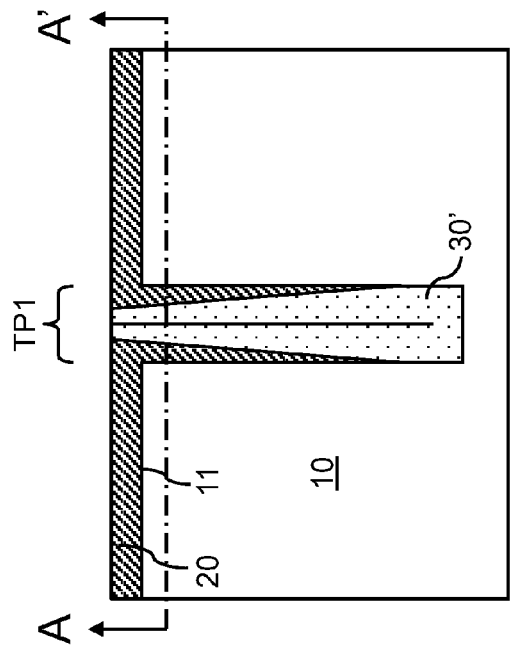
FIGS. 4B and 4C are vertical cross-sectional views of the exemplary device structure in FIG. 4A along the vertical planes B-B' and C-C', respectively.
Figure 4C:
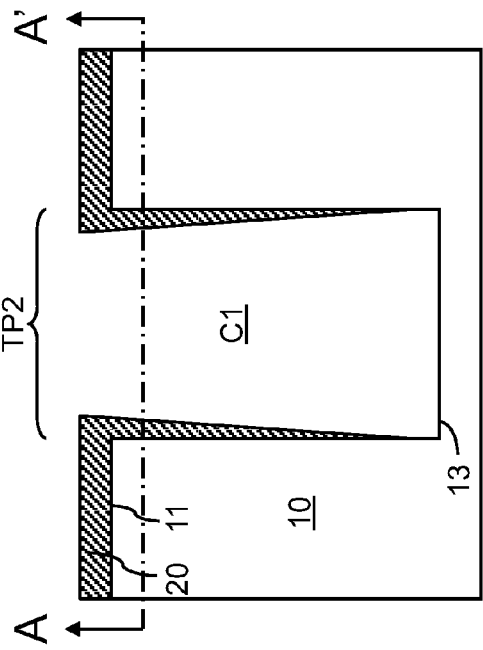
Figure 4A:
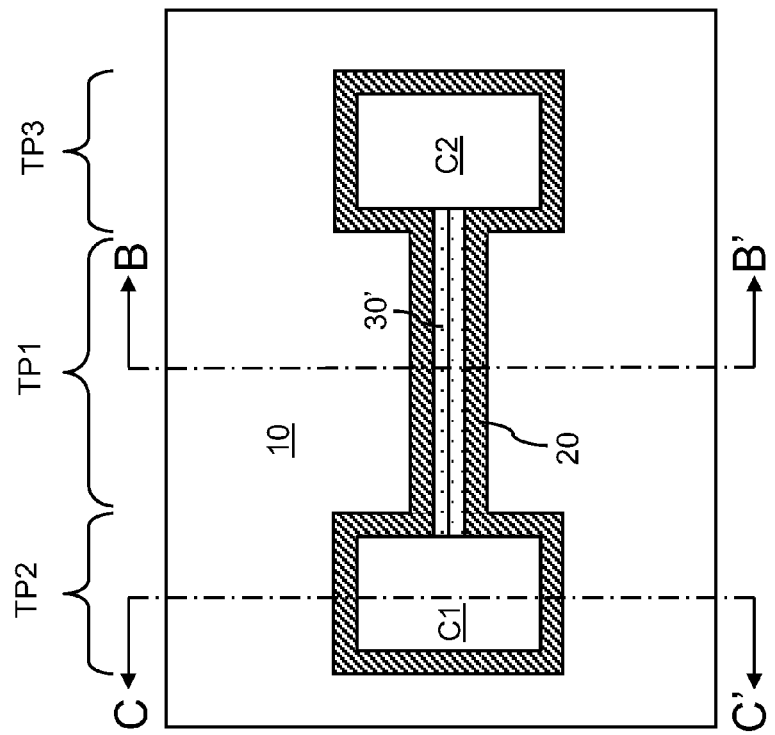
FIG. 4A is a horizontal cross-sectional view along the plane A-A' in FIGS. 4B and 4C of the exemplary device structure after removal of the gap fill layer from a second trench portion TP2 and a third trench portion TP3.

Referring to FIGS. 4A-4C, an isotropic etch is performed to remove exposed portions of the gap fill layer 30. The isotropic etch may be an isotropic dry etch or a wet etch. The isotropic etch is selective to the conductive layer 20, i.e., removes the material of the gap fill layer 30 but does not substantially remove the conductive material layer 20. All of the material of the gap fill layer 30 is removed from above the topmost surface of the conductive layer 20. Further, the portions of the gap fill layer 30 located on the vertical portions of the conductive layer 20 or on the sidewalls and bottom surfaces of the second and third trench portions (TP2, TP3) are also removed. In other words, the gap fill layer 30 is removed from within the second and third trench portions (TP2, TP3). After the isotropic etch, i.e., after the removing of the gap fill layer 30 from within the second and third trench portions (TP2, TP3), the conductive layer 20 and a remaining portion of the gap fill layer 30 completely fill the first trench portion TP1. The remaining portion of the gap fill layer 30 is herein referred to as a gap fill portion 30'.

Referring to FIGS. 5A-5C, a masking layer 40 is applied over the exposed surfaces including the top horizontal surface of the conductive layer 20 above the top surface 11 of the substrate 10 and the surfaces within the first and second cavities (C1, C2). In one embodiment, the masking layer 40 does not completely fill the first and second cavities (C1, C2). In another embodiment, the masking layer 40 comprises a material that may be removed selective to the conductive layer 20 and the substrate 10 from within the second and third trench portions (TP2, TP3). The masking layer 40 may be a photoresist, or may be a material that may be lithographically patterned employing a photoresist layer that is applied on the masking layer.

The masking layer 40 is patterned employing lithographic methods. After patterning, the masking layer 40 straddles above and across the first trench portion TP1. The area of the masking layer 40 includes a first area A1 over a portion of the conductive layer 20 on one side of the pair of the first parallel sidewalls, a second area A2 over a portion of the conductive layer 20 on the other side of the first parallel sidewalls, and a third area A3 of over a middle portion of the gap fill portion 30' and between the first area A1 and the second area A2. The first, second, and the third areas (A1, A2, A3) are contiguous. The masking layer 40 does not cover the area of the first cavity C1 or the second cavity C2. Thus, all vertical portions of the conductive layer 20 within the second and third trench portions (TP1, TP2) are exposed at this step.

Figure 6B:
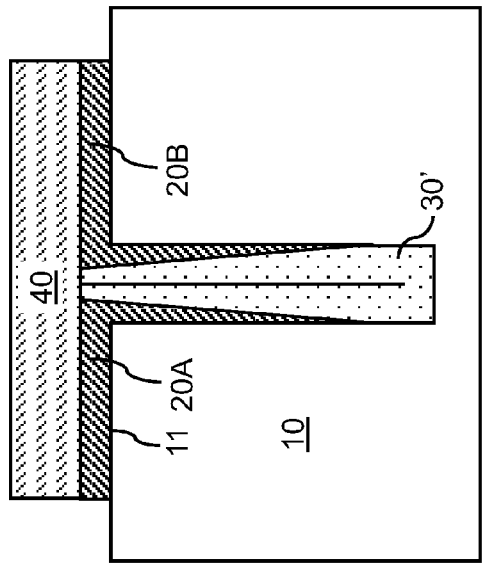
FIGS. 6B and 6C are vertical cross-sectional views of the exemplary device structure in FIG. 6A along the vertical planes B-B' and C-C', respectively.
Figure 6C:
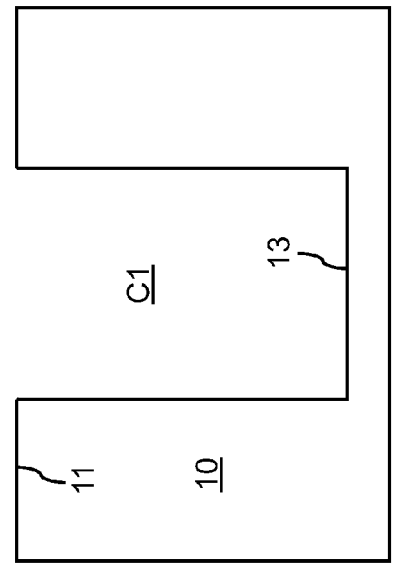
Figure 6A:
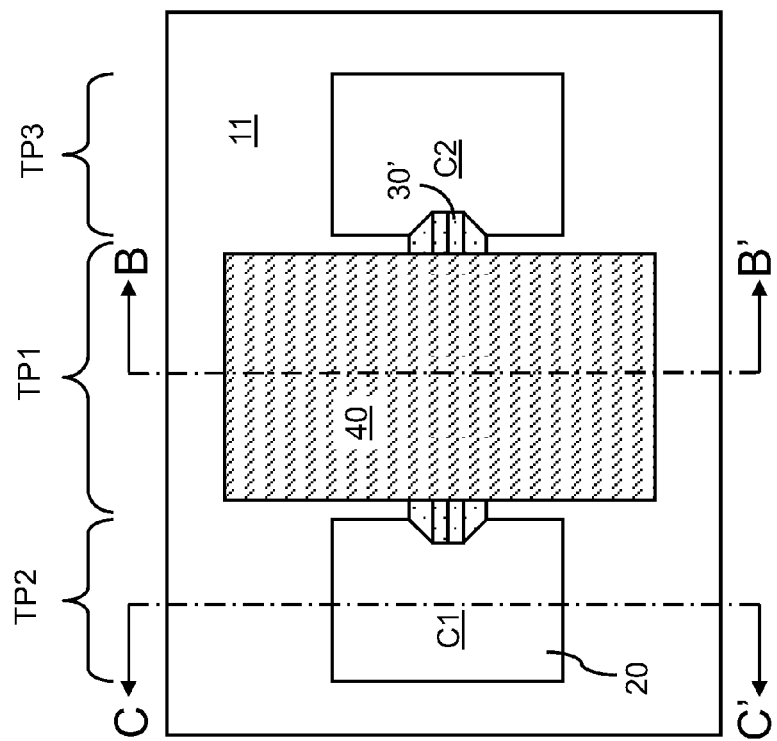
FIG. 6A is a top-down view of the exemplary device structure after removing the conductive layer from within the second trench portion TP2 and the third trench portion TP3.

Referring to FIGS. 6A-6C, the conductive layer 20 is patterned by an etch employing the masking layer 40 as an etch mask. A1 exposed portions of the conductive layer 20 is removed from outside the areas covered by the masking layer 40. Thus, the conductive layer 20 is removed from within the second and third trench portions (TP2, TP3). The etch may be an isotropic etch so that removal of the vertical portions of the conductive layer 20 from within the second and third trenches is facilitated. The remaining portions of the conductive layer 20 after the etch include a first conductive plate 20A and a second conductive plate 20B, which are collectively referred to as a pair of conductive plates (20A, 20B) herein. The first conductive plate 20A is located on one side of the first trench portion TP1, and the second conductive plate 20B is located on the other side of the second trench portion TP2.

The sidewalls of the insulating layer of the substrate 10 are exposed in the second and third trench portions (TP2, TP3) after the patterning of the conductive layer 20. The pair of conductive plates (20A, 20B) is located directly on the first trench portion TP1 and the top surface 11 of the substrate 10, which is an upper horizontal surface of the insulating layer. Each of the pair of conducive plates (20A, 20B) does not contact the other of the pair of conductive plates (20A, 20B), i.e., each of the pair of conducive plates (20A, 20B) is disjoined from the other.

The pair of conductive plates (20A, 20B) does not directly contact the second and third trench portions (TP2, TP3). The pair of conductive plates (20A, 20B) includes the same material as the material of the conductive layer 20, so that the pair of conductive plates (20A, 20B) may include a metal or a doped conductive semiconductor material. Preferably, the pair of conductive plates (20A, 20B) is a pair of metal plates consisting essentially of at least one metal and/or at least one conductive metal compound.

Referring to FIGS. 7A-7C, the masking layer 40 is removed selective to the pair of conductive plates (20A, 20B) and preferably, selective to the substrate 10. For example, if the masking layer 40 is a photoresist, the masking layer 40 may be removed by ashing.

Each of the pair of conductive plates (20A, 20B) has a horizontal portion HP and a tapered vertical portion VP. The width of the tapered vertical portion VP decreases from the top surface 11 of the substrate 10, which is the upper horizontal surface of the dielectric layer in the substrate 10, with distance toward the bottom surface 13 of the contiguous deep trench (TP1, TP2, TP3).

Optionally but preferably, a first conductive contact structure 50A is formed directly on the horizontal portion HP of the first conductive plate 20A, and a second conductive contact structure 50B is formed directly on the horizontal portion (included in the second conductive plate 20B but is not separately shown) of the second conductive plate 20B. The first and second conductive contact structures (50A, 50B) may be any type of contact structure. For example, the first and second conductive contact structures (50A, 50B) may be a solder ball contact structure, a wirebond structure or integrated into the semiconductor build process.

Thus, the exemplary device structure of the present invention includes a substrate 10, which includes an insulating layer having a top surface 11 and a bottom surface 13, and a contiguous trench (TP1, TP2, TP3) located in the insulating layer, and a pair of conductive plates (20A, 20B). The contiguous trench includes the first trench portion TP1, the second trench portion TP2, and the third trench portion TP3. The first trench portion has a pair of first parallel sidewalls separated by the first width W1, and the second and third trench portions (TP2, TP3) are directly and laterally adjoined to the first trench portion TP1.

Each of the pair of conductive plates (20A, 20B) is located on one side of the first trench portion TP1, does not contact the other of the pair of conductive plates (20A, 20B), i.e., disjoined from the other of the pair of conductive plates (20A, 20B), and has a horizontal portion HP and a tapered vertical portion VP. The horizontal portion HP is located directly on the top surface 11 of the substrate 10, and the width of the tapered vertical portion VP decreases from the top surface 11 with distance toward the bottom surface 13 of the contiguous deep trench (TP1, TP2, TP3).

All bottom surfaces 13 of the contiguous deep trench (TP1, TP2, TP3), all surfaces of the second and third trench portions (TP2, TP3), and a lower portion of each of the pair of first parallel sidewalls are exposed without contacting a solid phase material. The tapered vertical portion VP terminates on a sidewall of the first trench portion TP1, and does not directly contact any bottom surface 13 of the contiguous trench (TP1, TP2, TP3).

The exemplary device structure of the present invention may be employed as a detector. In case a gas phase material is detected, the gas phase material may induce changes in leakage current, capacitance, or inductance between the pair of conductive plates (20A, 20B). In case a property of a liquid phase material is detected, the liquid phase material may induce changes in leakage current, capacitance, or inductance between the pair of conductive plates (20A, 20B). By establishing a correlation between measured electrical properties between the pair of conductive plates (20A, 20B), the exemplary device structure of the present invention may be employed as a particle detector, a pH detector, a fire alarm, or any other type of device configured to detect change of the composition of the material between the pair of conductive plates (20A, 20B).

Further, the exemplary device structure of the present invention may be employed as a capacitor, an inductor, a combination thereof, or any other component of an electronic circuit such as a signal filter.

The exemplary device structure of the present invention provides a device with a separation distance between a pair of conductive plates (20A, 20B) that may be less than the critical dimension of a lithography tool. In other words, the separation distance between the pair of conductive plates (20A, 20B) is less than the first width W1, which may be as small as the critical dimension of the lithography tool, e.g., 40 nm. The small separation distance between the pair of conductive plates (20A, 20B) provides enhanced performance of the exemplary device structure of the present invention than conventional devices that have a spacing at least equal to the critical dimension of a lithography tool.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a device structure comprising:
    forming a contiguous trench in an insulating layer of a substrate, wherein said contiguous trench includes first, second, and third trench portions, said first trench portion has a pair of first parallel sidewalls separated by a first width, and said second and third trench portions are directly and laterally adjoined to said first trench portion, wherein said second trench portion has a pair of second parallel sidewalls separated by a second width greater than said first width, and said third trench portion has a pair of third parallel sidewalls separated by a third width greater than said first width; and
    forming a pair of conductive plates directly on said first trench portion and a horizontal surface of said insulating layer, wherein each of said pair of conductive plates does not contact the other of said pair of conductive plates.

2. The method of claim 1, wherein said forming of said pair of conductive plates comprises forming each of said pair of conductive plates to include a horizontal portion that overlies said horizontal surface of said insulating layer and to include a tapered vertical portion formed directly on said first parallel sidewalls of said first trench portion.

3. The method of claim 2, wherein said pair of conductive plates is formed such that a width of said tapered vertical portion decreases from said horizontal surface with distance toward a bottom surface of said contiguous trench.

4. The method of claim 3, wherein said pair of conductive plates is formed by forming a conductive layer including said tapered vertical portion directly on physically exposed surfaces of said insulating layer within said contiguous trench, wherein said tapered vertical portion terminates on said first parallel sidewalls of said first trench portion.

5. The method of claim 4, wherein said tapered vertical portion does not directly contact any bottom surface of said contiguous trench upon formation.

6. The method of claim 1, wherein said forming of said pair of conductive plates comprises forming a conductive layer directly on said horizontal surface of said insulating layer and an upper portion of sidewalls of said contiguous trench.

7. The method of claim 6, wherein said conductive layer does not contact a bottom surface of said contiguous trench or a lower portion of said sidewalls of said contiguous trench.

8. The method of claim 7, wherein said conductive layer has a tapered profile in each of said first, second, and third trench portions, and wherein a thickness of said conductive layer decreases with distance from said horizontal surface of said insulating layer.

9. The method of claim 6, wherein said forming of said conductive layer comprises employing a non-conformal deposition process to deposit said conductive layer.

10. The method of claim 6, further comprising forming a gap fill layer on said conductive layer, wherein said gap fill layer completely plugs said first trench portion.

11. The method of claim 10, wherein a first cavity is present in said second trench portion and a second cavity is present in said third trench portion after said forming of said gap fill layer.

12. The method of claim 11, wherein said gap fill layer is formed by a conformal deposition.

13. The method of claim 11, further comprising removing portions of said gap fill layer from within said second and third trench portions, wherein said conductive layer and a remaining portion of said gap fill layer completely fill said first trench portion after said removing said portions of said gap fill layer.

14. The method of claim 6, further comprising patterning said conductive layer to form said pair of conductive plates, wherein said conductive layer is removed from within said second and third trench portions during said patterning.

15. The method of claim 14, wherein said first trench portion is completely filled by said conductive layer and a portion of a gap fill layer prior to said patterning of said conductive layer.

16. The method of claim 15, wherein sidewalls of said insulating layer are physically exposed in said second and third trench portions after said patterning of said conductive layer.

17. The method of claim 1, wherein said contiguous trench is formed such that said pair of first parallel sidewalls, said pair of second parallel sidewalls, and said pair of third parallel sidewalls are parallel among one another.

18. The method of claim 1, wherein said contiguous trench is formed such that said second trench portion and said third trench portion have rectangular cross-sectional areas, wherein widthwise sidewalls of said second trench portion directly adjoin one end of each of said pair of first parallel sidewalls, and widthwise sidewalls of said third trench portion directly adjoin another end of each of said pair of first parallel sidewalls.

19. The method of claim 1, wherein said contiguous trench is formed such that said pair of conductive plates have lateral surfaces along a direction of said first width, and said lateral surfaces overlie said first trench portion and are laterally offset from said second trench portion and said third trench portion.

* * * * *